(12) United States Patent
Yu et al.

(10) Patent No.: US 6,404,374 B1
(45) Date of Patent: Jun. 11, 2002

(54) COMPARATOR CIRCUIT FOR ANALOG-TO-DIGITAL CONVERTER

(75) Inventors: Chu-Chiao Yu; Her-Y Shih; Yen-Hui Wang, all of Hsin-Chu (TW)

(73) Assignee: Topic Semiconductor Corp., Hsin-Chu (TW)

( * ) Notice: Subject to any disclaimer, the term of this patent is extended or adjusted under 35 U.S.C. 154(b) by 0 days.

(21) Appl. No.: 09/689,674

(22) Filed: Oct. 13, 2000

(51) Int. Cl.[7] .............................................. H03M 1/36
(52) U.S. Cl. ...................................... 341/159; 341/156
(58) Field of Search ................................ 341/156–159

(56) References Cited

U.S. PATENT DOCUMENTS 5,157,397 A * 10/1992 Vernon
5,291,198 A * 3/1994 Dingwall et al. ........... 341/159

* cited by examiner

Primary Examiner—Howard L. Williams
(74) Attorney, Agent, or Firm—Bacon & Thomas

(57) ABSTRACT

A comparator circuit used in an analog-to-digital converter includes an input voltage signal line; a reference voltage signal line; a plurality of comparators connected to said input voltage signal line and said reference voltage signal line; a plurality of amplifiers corresponding separately to each of said plurality of comparators and connected respectively between said input voltage signal lines, said reference voltage signal lines, and their corresponding comparators; and a thermocode channel connected to outputs of said plurality of comparators. A plurality of resistors with resistances in a constant ratio are provided in said reference voltage signal line and each is connected between the inputs of two adjacent amplifiers. A plurality of averaging capacitors are provided and each is connected between the outputs of two adjacent comparators; wherein said plurality of averaging capacitors may have the same capacitance.

3 Claims, 6 Drawing Sheets

COMPARATOR CIRCUIT FOR ANALOG-TO-DIGITAL CONVERTER

FIELD OF INVENTION

The present invention relates to a comparator circuit for analog-to-digital converter, especially to a comparator circuit with equalization effects that can be used in an analog-to-digital converter.

BACKGROUND OF INVENTION

The analog-to-digital converter (ADC or A/D converter) is a useful circuit in the application of signal processing. An ADC is used to convert analog signals into digital signals. Most frequently used ADC's include flash ADC, interpolative ADC, folding ADC, two stage ADC etc.

FIG. 1 shows the circuit diagram of a conventional flash ADC. This flash ADC was disclosed in U.S. Pat. No. 5,835,048 as a prior art. As shown in this figure, such a flash ADC comprises a thermocode to binary signal decoder 10 that converts input signals into binary codes according to thermocodes generated by a comparator circuit to be described in details hereinafter. The thermocodes are generated as the result of comparing the voltages of the input signals with reference voltages in a series of comparators 24a, 24b, 24c and 24d. The reference voltages in the comparators 24a, 24b, 24c and 24d are in a constant ratio. For example, the reference voltage of comparator 24a may be greater than that of comparator 24b for an LSB (a least significant bit) of the ADC.

In order to compare the voltage of the input signals with the reference voltages, the input signal Vin is input from an input line 20 and is forwarded to all comparators. A reference voltage Vref is input from a reference signal line 20 and is regulated by resistors 18a, 18b, 18c and 18d, such that reference voltages in the respective comparators are in a predetermined ratio. The operation of the comparator circuit is well known to those skilled in the art and detailed description thereof is thus omitted.

In order to enhance the accuracy of the comparator circuit, preamplifiers 14a, 14b, 14c and 14d are provided at the upstream position to comparators 24a, 24b, 24c and 24d, respectively. The function of the preamplifiers 14a, 14b, 14c and 14d is to amplify the input signals and the reference voltages, such that the small differences between the voltages of input signals and the reference voltages may be amplified. In such a circuit, the input signals Vin and the reference voltage Vref are first input to the preamplifiers 14a, 14b, 14c and 14d and are then forwarded to comparators 24a, 24b, 24c and 24d. After the voltage of an input signal is compared with the reference voltages, a thermocode representing the result of the comparison is generated. In this circuit, the offset voltage of the comparators and the preamplifiers may bring a decisive influence to the accuracy of the comparator circuit.

Take the CMOS flash ADC as an example. If the requirement of its resolution is 10 bits, 1,024 comparators will be needed in the comparator circuit. When the input voltage of the circuit is 2V, the offset voltage of every comparator shall be smaller than 1 mV (½ LSB), such that correct results of comparison may be obtained. However, in an ordinary CMOS comparator, its offset voltage can be tens of mV. Even though it is possible to provide preamplifiers at the input of the comparators to amplify the input signals, the reaction speed of the total circuit will be damaged due to the high gain values of the preamplifiers. Although it is also possible to enlarge the space of the transistors at the input of the amplifiers to reduce the offsets of the preamplifier brought by errors existing in the manufacture process, the total space occupied by the circuit will become too large for an ADC and the over loading of capacitance in the preamplifiers will damage the operation speed of the circuit. In addition, the offsets in the preamplifiers themselves will damage the accuracy of other components of the comparator circuit.

In the conventional art, the above-said problems may be solved by using an averaging circuit. FIG. 2 shows an analog-to-digital converter with improved cell mismatch compensation as disclosed in U.S. Pat. No. 5,835,048. In this circuit, a string of resistors are provided to the outputs of the preamplifiers to average the offsets of the preamplifiers. After the averaging, the accuracy of the circuit may be improved, since the offsets of the preamplifiers are averaged.

Another approach to solve the above-said problem is disclosed by U.S. Pat. No. 5,175,550. This invention also used a string of resistors provided at the output of the preamplifiers to average the offsets of the preamplifiers. The major difference between the '048 patent and the '550 patent rest in that the '048 patent used an active load and the '550 patent used a passive load. As a result, in the '550 patent the resistors are used as the load of the preamplifiers and in the '048 patent the transistor with a high output resistance is used as load. The '048 patent provided an improvement over the '550 patent, because the smaller the averaging resistance (the resistances connected in the horizontal direction) is, the better the averaging effects, i.e., the smaller the offset voltage, will be. However, when the averaging resistance is reduced, the gains of the preamplifiers will also be reduced. If the averaging effects of the circuit of both patents are the same, i.e., if both have the same averaging resistance, preamplifiers with greater gains will still have greater gains, even if the averaging resistors are added. In other words, when the space used by the resistors is the same, a preamplifier wherein the resistor is used as load will have a smaller gain than that of a preamplifier wherein the current source is used as load. This is the major improvement provided by the '048 patent.

Although the above-mentioned inventions are capable of averaging the outputs of the preamplifiers, it inherited drawbacks as well. In these conventional arts, when the resistance of the resistors applied to the outputs of the preamplifiers is small, gains of the preamplifiers will not be sufficient to provide their functions. On the other hand, if the resistance of the resistors is raised, the averaging effect of the resistors will be damaged.

Generally speaking, the averaging resistor shall have a resistance of several K Ohms to tens of K Ohms to provide averaging effects. In such a range, the amplifying effect of the preamplifiers may also be maintained. However, the total space occupied by the resistors will become too large to be included in a commercially available IC chip.

In addition to that, applying averaging resistors at the outputs of the preamplifiers does not solve the influence brought to the comparator by the offset of the input voltage.

It is thus a need in the industry to provide a novel comparator circuit for an analog-to-digital converter which may effectively reduce the offset of the comparator circuit.

It is also necessary to provide a novel comparator circuit for an analog-to-digital converter in which the offset voltages of the comparator circuit may be averaged.

It is also necessary to provide a novel comparator circuit for an analog-to-digital converter wherein offsets of signals may be effectively reduced without the need of providing additional space for circuits.

OBJECTIVES OF THE INVENTION

The objective of this invention is to provide a novel comparator circuit for an analog-to-digital converter which may effectively reduce the offset of the comparator circuit.

Another objective of this invention is to provide a novel comparator circuit for an analog-to-digital converter in which the offset voltages of the comparator circuit may be averaged.

Another objective of this invention is to provide a novel comparator circuit for an analog-to-digital converter wherein offsets of signals may be effectively reduced without the need of providing additional space for circuits.

SUMMARY OF INVENTION

According to the comparator circuit for analog-to-digital converter of this invention, the comparator circuit may be used in an analog-to-digital converter comprising: an input voltage signal line; a reference voltage signal line; a plurality of comparators connected in parallel to said input voltage signal line and said reference voltage signal line; a plurality of amplifiers corresponding separately to each of said plurality of comparators and connected respectively between said input voltage signal lines, said reference voltage signal lines, and their corresponding comparators; and a thermocode channel connected to outputs of said plurality of comparators in parallel; wherein a plurality of resistors with resistances in a constant ratio are provided in said reference voltage signal line and each resistor is positioned between the inputs of two adjacent amplifiers. In said comparator circuit for analog-to-converter, a plurality of averaging capacitors are provided and each averaging capacitor is positioned between the outputs of two adjacent comparators; wherein said plurality of averaging capacitors may have the same capacitance.

These and other objectives and advantages of this invention may be clearly understood from the detailed description be referring to the following drawings.

DETAILED DESCRIPTION OF THE INVENTION

The following is a detailed description of the comparator circuit for analog-to-digital converter of this invention.

Figure 3:
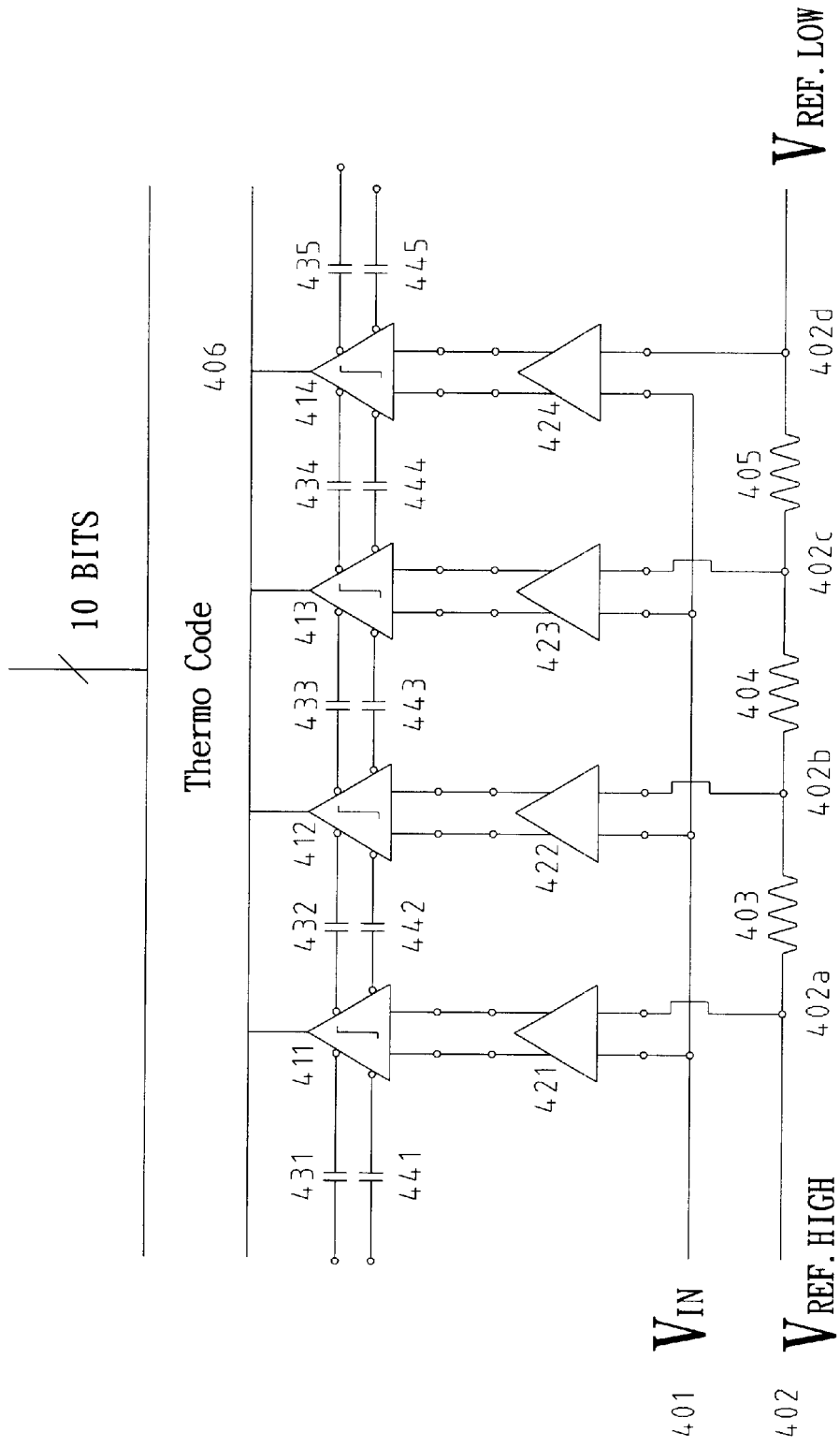
FIG. 3 illustrates the circuit diagram of the comparator circuit for analog-to-digital converter of this invention.

FIG. 3 shows the circuit diagram of the comparator circuit for analog-to-digital converter of this invention. As shown in this figure, the comparator circuit of this invention is used in an analog-to-digital converter comprising: an input voltage signal line 401 to input a signal voltage Vin to be compared in the comparator; a reference voltage signal line 402 to input a reference voltage Vref to function as basis of comparison; a plurality of amplifiers 421, 422, 423, 424, ..., with their respective inputs connected to said input voltage signal line 401 and said reference voltage signal line 402, separately to amplify signals provided by said input voltage signal line 401 and by said reference voltage signal line 402; a plurality of resistors 403, 404, 405, ..., connected in series in said reference voltage signal line 402 wherein resistances of said resistors 403, 404, 405, ... are in a constant ratio and each resistor is provided between connections 402a, 402b, 402c, ..., of said reference voltage signal line 402 and each of said amplifiers 421, 422, 423, 424, ... ; a plurality of comparators 411, 412, 413, 414, ..., each connected to respective outputs of said plurality of amplifiers 421, 422, 423, 424, ..., to compare input voltage and reference voltage being amplified respectively by said amplifiers 421, 422, 423, 424, ... and to output thermocodes representing results of said comparison; a first group of averaging capacitors 431, 432, 433, 434, 435, ... and a second group of averaging capacitors 441, 442, 443, 444, 445, ... ; wherein each averaging capacitor is connected to an output of a comparator and an output of another comparator; and an output channel to convert thermocodes output by said plurality of comparators 411, 412, 413, 414, ... into digital codes. In this figure, the output channel outputs 10-bit digital codes. As a result, the analog-to-digital converter comprises 1,024 comparators and 1,024 amplifiers.

In the operation of the above-said circuit, in one working cycle, the voltage Vin of an analog signal is input from the input signal line 401 and a reference voltage Vref is input from the reference voltage signal line 402. In general applications, the voltage of the analog signal is lower than that of the reference voltage, i.e., 0<Vin<Vref. The reference voltage enters into the amplifiers 421, 422, 423, ... through the resistors 403, 404, 405, ... At inputs of the amplifiers 421, 422, 423, ..., the reference voltages are in a constant ratio. In another word, they are 0, $V_{LSB}$, 2 $V_{LSB}$, 3 $V_{LSB}$, ..., Vref. $V_{LSB}$=Vref/$2^N$, N is the number of bits of the A/D converter.

The input signal enters into the amplifiers 421, 422, 423, ... from the input signal line 401. In the amplifiers 421, 422, 423, ..., the input voltage and the reference voltages are amplified at the same time. Thereafter, they are supplied to the comparators 411, 412, 413, ..., in which the input voltage and the reference voltages which have been amplified are compared. The results of the comparison being 0 or 1 are output to the output channel 406 as "thermocodes". The output channel 406 then converts the thermocode that is input to it within a working cycle into a digital code.

Although it is not intended to limit the scope of this invention, according to this invention, averaging capacitors connected between the outputs of two adjacent comparators may provide averaging effects to the outputs of the whole converter circuit. As offset voltages may arise in both the preamplifier circuit and the comparator circuit, such offset voltages may be reduced at one time by averaging capacitors provided between the outputs of two adjacent comparators.

This invention is particular useful when a latch is provided in each of the comparators. For such a comparator, in the circuit of the latch stage, it may be not possible to average the offset of the circuit. A major reason for such problem is that any averaging circuit may damage the result of the comparison, since the outputs of a latch that is subject to the averaging circuit is either HIGH or LOW. As in this invention, averaging capacitors are provided, these averaging capacitors may function as resistors with relatively small resistance that won't damage the result of the comparison.

According to the characteristics of the latch circuit, a voltage supplied to the latch at the initial stage may initial the latch circuit such that the latch may provide positive feedback functions. Thereafter, when the whole circuit starts to work, the level of voltage supplied to the latch will not influence the function of the latch. The averaging capacitors as provided in this invention may function as averaging resistors in the initial stage of the latch. During this stage the equivalent impedance of the averaging capacitors is relatively small such that it may provide averaging functions to the offset voltage at output of the comparator. After the initial stage, the average capacitors lose their functions and will not influence the normal functions of the latch itself or of the comparator.

In the embodiment of this invention, all the averaging capacitors have the same capacitance, although other arrangements may also be applicable in this invention.

Figure 4:
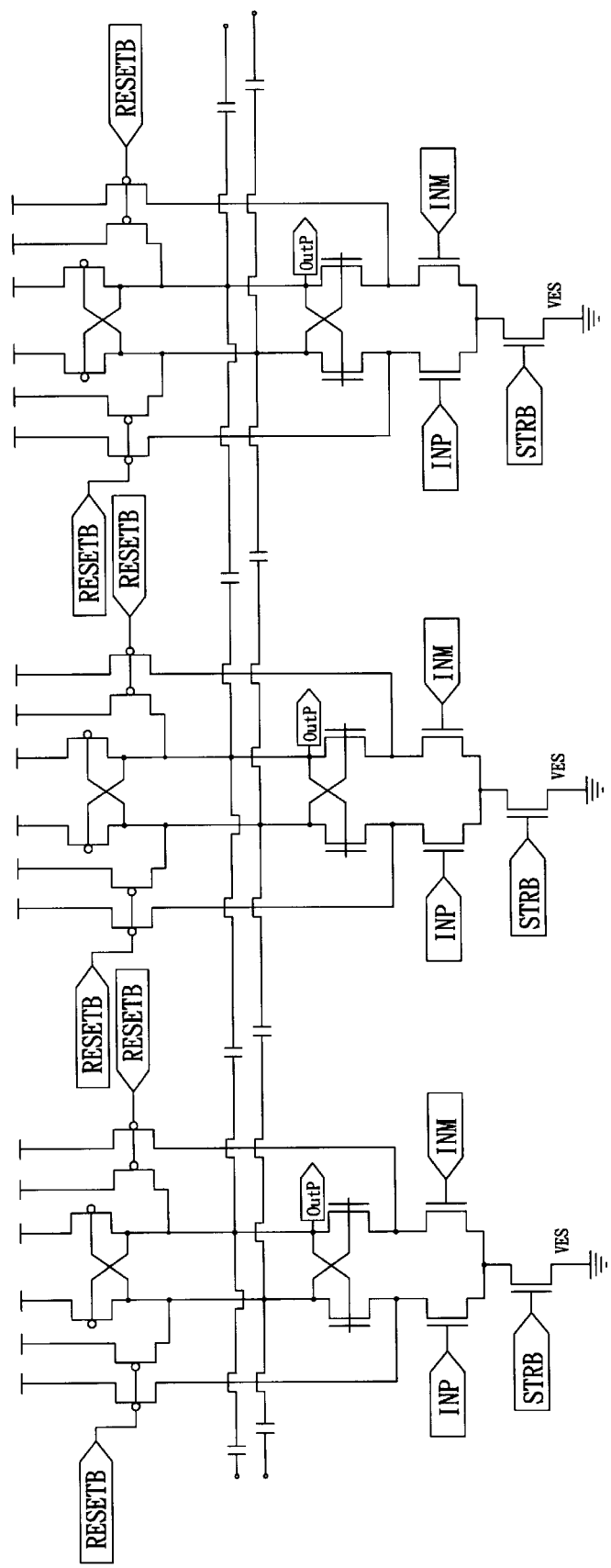
FIG. 4 illustrates a detailed circuit diagram of the comparator circuit for analog-to-digital converter.

FIG. 4 shows a detailed circuit diagram of the comparator for analog-to-digital converter of this invention. In this figure, RESETB represents a reset signal and STRB represents a sampling signal. In the circuit of this figure, when RESETB is LOW, output of the comparators will be reset to VDD. When RESETB is HIGH, the comparison is operated.

In the embodiment of this invention, the capacitance of the averaging capacitors may be as low as 20 fF. This is partly because that, in order to generate a impedance by a capacitor, the higher the operating frequency is, the smaller the capacitance of the capacitor will be needed. Since the averaging capacitors are positioned at the outputs of the comparators, not at the side of the amplifiers, the specification of the capacitors will not influence the speed of the circuit.

Figure 1:
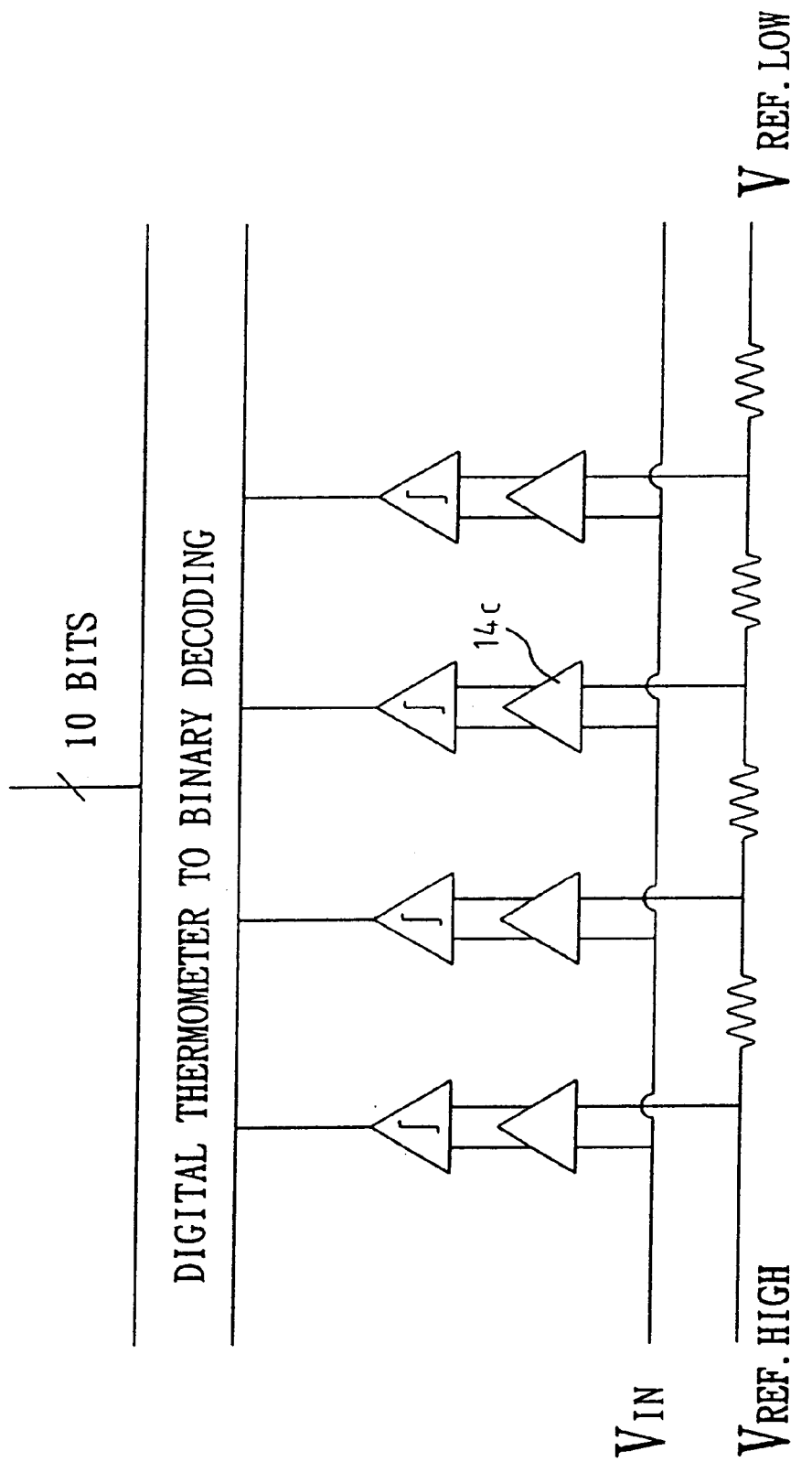
FIG. 1 illustrates the circuit diagram of a conventional analog-to-digital converter.
Figure 2:
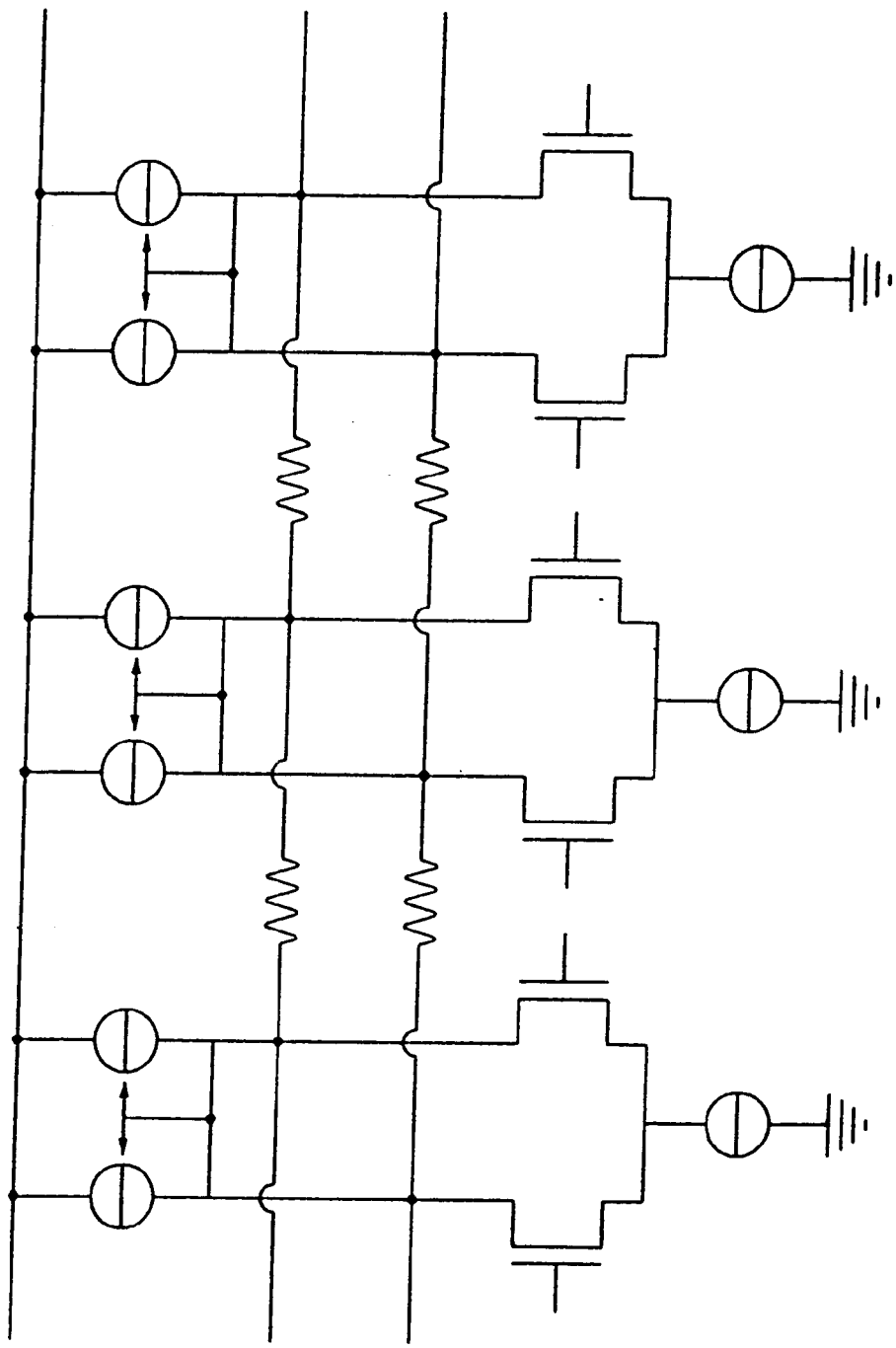
FIG. 2 illustrates the circuit diagram of an improved conventional analog-to-digital converter.
Figure 5:
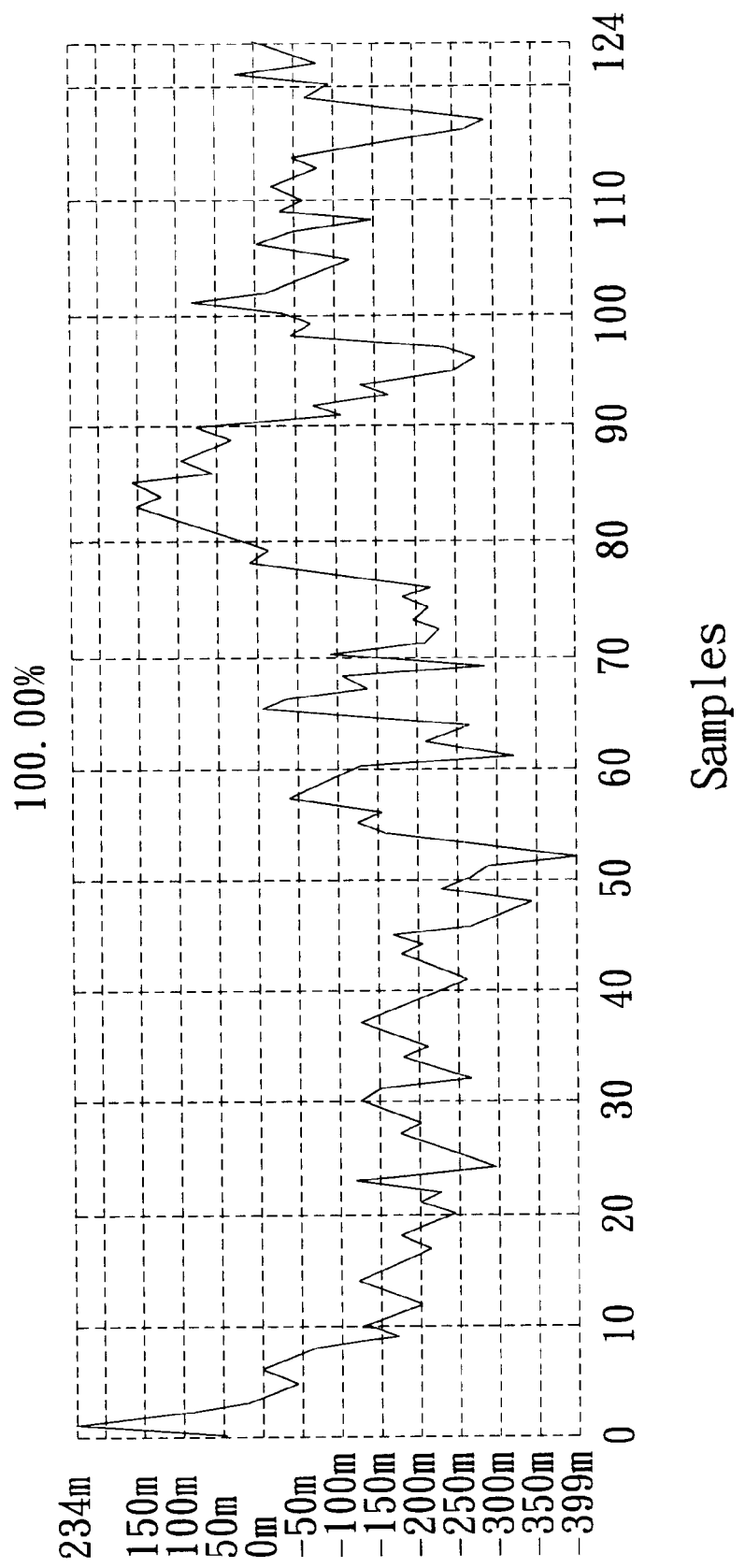
FIG. 5 shows the integral non-linearity of signals converted by a the analog-to-digital converter of FIG. 2, as simulated in a personal computer.
Figure 6:
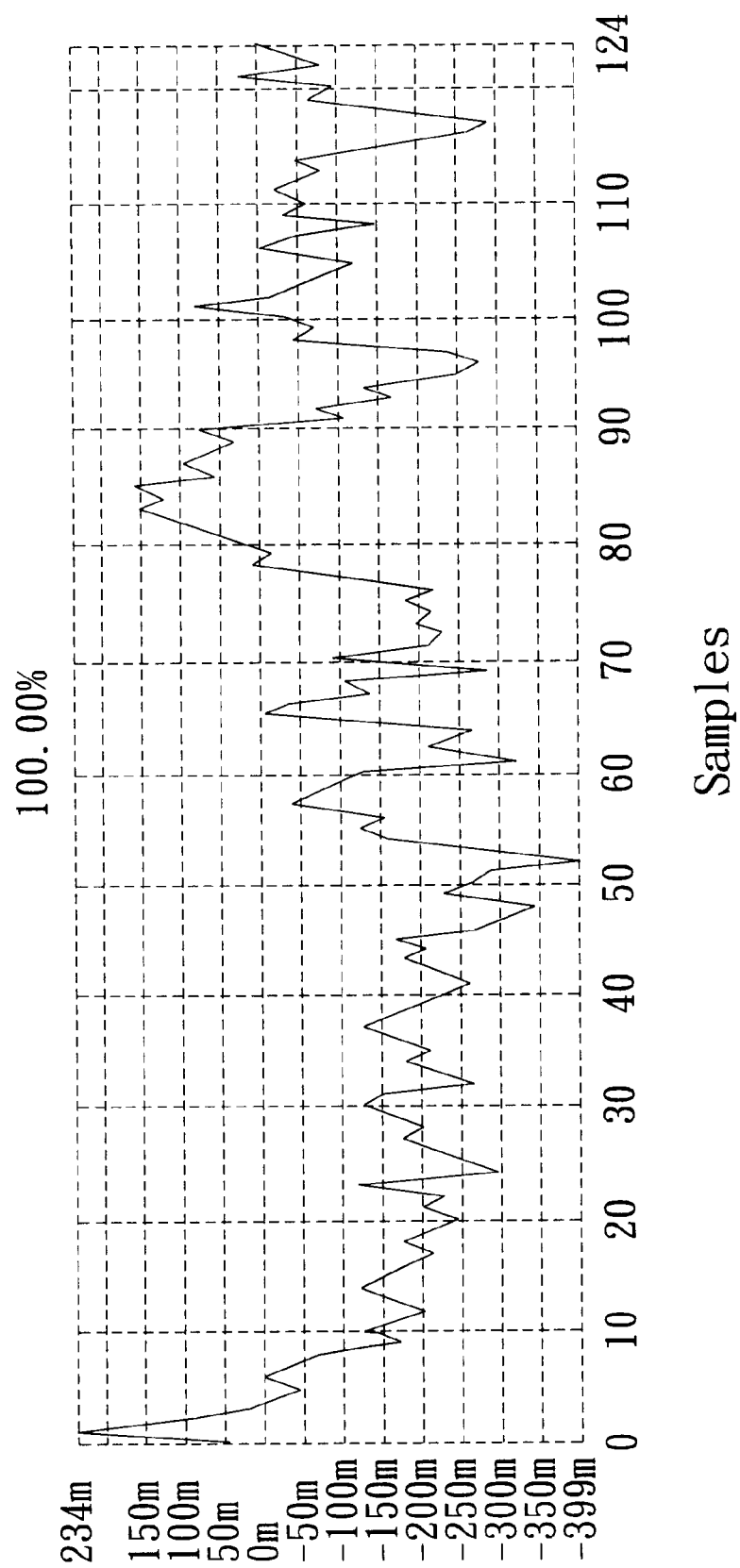
FIG. 6 shows the integral non-linearity of signals converted by the analog-to-digital converter provided with the comparator circuit of this invention, as simulated in a personal computer.

FIG. 5 and FIG. 6 separately show the integral non-linearity of signals being converted by the A/D converter of FIG. 2 and by the A/D converter of FIG. 4, as simulated in a personal computer. It is obviously shown that the comparator circuit of this invention may effectively reduce the offsets brought to the circuit due to the mismatch of the transistors in the latch stage of the comparators and is able to improve the resolution of an A/D converter to 1–2 bits.

In the above detailed description of the embodiment of this invention, the analog-to-digital converter is a flash A/D converter. It is however understood that the invented comparator circuit may be used in an interpolation A/D converter, a folding A/D converter, a two-step A/D converter etc.

As the present invention has been shown and described with reference to preferred embodiments thereof, those skilled in the art will recognize that the above and other changes may be made therein without departing from the spirit and scope of the invention.

What is claimed is:

1. An analog-to-digital converter comprising:

an input voltage signal line; a reference voltage signal line; a plurality of comparators connected to said input voltage signal line and said reference voltage signal line; a plurality of amplifiers corresponding to said plurality of comparators and connected respectively between said input voltage signal line, said reference voltage signal line, and their corresponding comparators; and a thermocode channel connected to outputs of said plurality of comparators; wherein a plurality of resistors are provided in said reference voltage signal line, between connections of said reference voltage signal and two adjacent amplifiers; and wherein each of said plurality of comparators comprises an input transistor;

characterized in that said analog-to-digital converter further comprises a plurality of averaging capacitors, each connects outputs of two adjacent comparators.

2. The analog-to-digital converter according to claim 1 wherein resistances of said plurality of resistors provided in said reference voltage signal line are in a constant ratio.

3. The analog-to digital converter according to claim 1 or 2 wherein said averaging capacitors have the same capacitance.

* * * * *